(12) United States Patent
Lebby et al.

(10) Patent No.: US 10,511,146 B2
(45) Date of Patent: Dec. 17, 2019

(54) GUIDE TRANSITION DEVICE WITH DIGITAL GRATING DEFLECTORS AND METHOD

(71) Applicant: Lightwave Logic Inc., Longmont, CO (US)

(72) Inventors: Michael Lebby, San Francisco, CA (US); Frederick J Leonberger, Sarasota, FL (US)

(73) Assignee: Lightwave Logic Inc., Longmont, CO (US)

( * ) Notice: Subject to any disclaimer, the term of this patent is extended or adjusted under 35 U.S.C. 154(b) by 0 days.

(21) Appl. No.: 15/812,630

(22) Filed: Nov. 14, 2017

(65) Prior Publication Data

US 2019/0148913 A1 May 16, 2019

(51) Int. Cl.
*H01S 5/12* (2006.01)
*H01S 5/183* (2006.01)
(Continued)

(52) U.S. Cl.
CPC ........ *H01S 5/1228* (2013.01); *G02B 6/12004* (2013.01); *G02B 6/4214* (2013.01);
(Continued)

(58) Field of Classification Search
CPC .... H01S 5/026; H01S 5/02292; H01S 5/1014; H01P 5/02–5/107; H01P 3/00–3/20; G02B 6/12002; G02B 2006/12076
See application file for complete search history.

(56) References Cited

U.S. PATENT DOCUMENTS 4,966,430 A * 10/1990 Weidel ................. G02B 6/2817
257/84
5,003,550 A * 3/1991 Welch ........................ H01S 5/42
372/102
(Continued)

FOREIGN PATENT DOCUMENTS

EP 2913902 A1 * 9/2015 ............... G02B 6/30
WO WO-2016011002 A1 * 1/2016 ......... G02B 6/12002

OTHER PUBLICATIONS

Groumas et al., "Complex Monolithic and InP Hybrid Integration on High Bandwidth Electro-Optic Polymer Platform", Aug. 15, 2012, Optics Letters, vol. 73, No. 16, 3465-3467 (Year: 2012).*
(Continued)

*Primary Examiner* — Joshua King
(74) *Attorney, Agent, or Firm* — Parsons & Goltry; Robert A. Parsons; Michael W. Goltry

(57) ABSTRACT

A guide transition device including a light source designed to generate a light beam, a light input port on a first plane and coupled to receive the light beam from the light source, a light output port on a second plane different than the first plane, the light output port designed to couple a received light beam to output equipment and plane shifting apparatus coupled to receive the light beam from the light input port on the first plane and to shift or transfer the light beam to the second plane. The plane shifting apparatus including one or more digital gratings each designed to deflect the light beam approximately ninety degrees. The plane shifting apparatus is coupled to transfer the light beam to the light output port on the second plane.

10 Claims, 8 Drawing Sheets

(51) Int. Cl.
*H01S 5/022* (2006.01)
*H01S 5/026* (2006.01)
*H01S 5/125* (2006.01)
*H01S 5/10* (2006.01)
*G02B 6/12* (2006.01)
*G02B 6/42* (2006.01)

(52) U.S. Cl.
CPC .......... *G02B 6/4215* (2013.01); *H01S 5/026* (2013.01); *H01S 5/02292* (2013.01); *H01S 5/1014* (2013.01); *H01S 5/125* (2013.01); *H01S 5/18308* (2013.01); *G02B 6/12002* (2013.01); *G02B 2006/12107* (2013.01); *G02B 2006/12121* (2013.01); *G02B 2006/12142* (2013.01)

(56) References Cited

U.S. PATENT DOCUMENTS

| | | | | |
|---|---|---|---|---|
| 5,051,790 | A * | 9/1991 | Hammer | G02B 6/43 257/443 |
| 5,125,054 | A * | 6/1992 | Ackley | G02B 6/30 385/130 |
| 5,218,584 | A * | 6/1993 | Gfeller | G11B 7/0908 369/112.27 |
| 5,321,718 | A * | 6/1994 | Waarts | G02F 1/37 359/326 |
| 5,937,129 | A * | 8/1999 | Jeong | G02B 6/12007 385/122 |
| 6,236,773 | B1 * | 5/2001 | Butler | G02B 6/12004 385/14 |
| 6,282,219 | B1 * | 8/2001 | Butler | G02B 6/12004 372/102 |
| 7,327,771 | B2 * | 2/2008 | Kim | G02B 6/12004 372/50.1 |
| 7,536,066 | B2 * | 5/2009 | Kato | G02B 6/12004 385/14 |
| 7,656,922 | B2 * | 2/2010 | Behfar | B82Y 20/00 257/79 |
| 9,341,786 | B1 * | 5/2016 | Gamache | G02B 6/30 |
| 2001/0041025 | A1 * | 11/2001 | Farahi | G02B 6/12002 385/14 |
| 2005/0224946 | A1 * | 10/2005 | Dutta | G02B 6/12002 257/686 |
| 2006/0239605 | A1 * | 10/2006 | Palen | G02B 6/4206 385/14 |
| 2009/0232443 | A1 * | 9/2009 | Oda | G02B 6/4214 385/14 |
| 2011/0052114 | A1 * | 3/2011 | Bernasconi | H01S 5/026 385/3 |
| 2011/0142395 | A1 * | 6/2011 | Fortusini | G02B 6/34 385/37 |
| 2011/0158278 | A1 * | 6/2011 | Koch | G02B 6/4204 372/45.012 |
| 2011/0222570 | A1 * | 9/2011 | Junesand | H01S 5/021 372/50.1 |
| 2012/0072931 | A1 * | 3/2012 | Imada | G11B 5/314 720/672 |
| 2014/0153605 | A1 * | 6/2014 | Arimoto | H01S 5/12 372/50.11 |
| 2014/0270618 | A1 * | 9/2014 | Dinu | G02F 1/225 385/3 |
| 2015/0063745 | A1 * | 3/2015 | Lin | H01S 5/0208 385/14 |
| 2016/0248225 | A1 * | 8/2016 | Sayyah | H01S 5/0228 |
| 2016/0294155 | A1 * | 10/2016 | Zheng | H01S 5/0228 |
| 2016/0380405 | A1 * | 12/2016 | Takiguchi | H01S 5/12 372/26 |
| 2017/0179680 | A1 * | 6/2017 | Mahgerefteh | G02B 6/12004 |
| 2017/0256915 | A1 * | 9/2017 | Ghosh | H01S 5/0421 |

OTHER PUBLICATIONS

Millan-Mejia et al., "Fabrication Technology of a Slot Waveguide Modulator in InP Membranes on Silicon (IMOS)", May 8-20, 2016, ECIO, 1-2 (Year: 2016).*
Zhang et al., "Passive and Electro-Optic Polymer Photonics and InP Electronics Integration", May 1, 2015, Proc. SPIE 9516, Integrated Optics: Physics and Simulations II, 951603 (Year: 2015).*
Zhang et al., "Hybrid Photonic Integration on a Polymer Platform", Sep. 21, 2015, Photonics, 1005-1026. (Year: 2015).*
Zhang et al., "Polymer-Based Hybride Integrated Photonic Devices for Silicon On-Chip Modulation and Board-Level Optical Interconnects", Jul. 24, 2013, IEEE Journal of Selected Topics in Quatum Electronics, vol. 19, No. 6, 1-15 (Year: 2013).*
Hochberg et al., "Terahertz All-Optical Modulation in a Silicon-Polymer Hybrid System", Aug. 20, 2006, Nature Materials, vol. 5, 703-709 (Year: 2006).*

* cited by examiner

- LARGE SPOT DESIGN - TOP OR PLAN VIEW
- MACH-ZEHNDER MODULATOR IMPLEMENTED BETWEEN TAPER REGIONS OF POLYMER

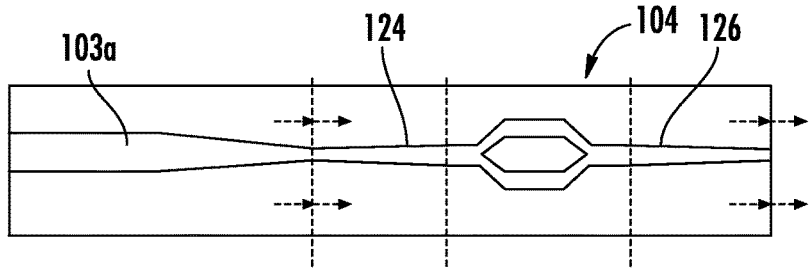

FIG. 8

- ANGLE ETCH InP (GaAs, GaN ETC) LASER SOURCE
  - INCORPORATE SPOT SIZE CONVERTER SO THAT LARGER SPOT CAN BE INTERNALLY REFLECTED UPWARDS (OR DOWNWARDS) VIA THE ANGLED ETCH
  - THE DOTTED LINES DEPICT THE LARGE SPOT OPTICAL BEAM THAT IS INTERNALLY REFLECTED OFF OF THE ANGLED ETCH

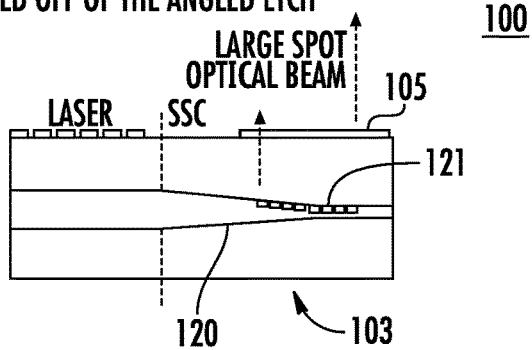

FIG. 9

GUIDE TRANSITION DEVICE WITH DIGITAL GRATING DEFLECTORS AND METHOD

FIELD OF THE INVENTION

This invention relates to guiding light from semiconductor lasers in layers of polymers on a semiconductor substrate and more particularly to transitioning light from one layer to another, using digital grating deflectors, to reduce optical cross-talk and other interference.

BACKGROUND OF THE INVENTION

Polymer modulators driven by semiconductor lasers are a popular apparatus for modulating a light beam. In a copending application entitled "Polymer Modulator and Laser Integrated on a Common Platform and Method", filed Aug. 31, 2017, with application Ser. No. 15/692,080, and incorporated herein by reference, the modulator and laser are integrated on a common platform, such as an InP chip or substrate.

One problem with including various light devices, such as light generating devices and light using devices, on a common plane or level is that light can couple between devices along unintended paths, such as through reflections or tunneling, to cause optical cross-talk and other interference. Further, light coupling between devices and between inputs and outputs can be inefficient with lost light traveling through the optical system to cause optical cross-talk and other interference.

In a copending patent application, entitled "Guide Transition Device and Method", filed Sep. 14, 2017, Ser. No. 15/704,739 and incorporated herein by reference, light generated by a source, such as a laser, is deflected between planes by plane shifting apparatus including angular deflection surfaces. In some applications, angular surfaces may be difficult or inconvenient to fabricate and use.

It would be highly advantageous, therefore, to remedy the foregoing and other deficiencies inherent in the prior art.

Accordingly, it is an object of the present invention to provide a new and improved guide transition device for efficiently coupling light between devices and to output apparatus.

It is another object of the present invention to provide a new and improved guide transition device for coupling light from one plane to another plane using digital grating deflectors.

SUMMARY OF THE INVENTION

Briefly to achieve the desired objects and advantages of the instant invention in accordance with a preferred embodiment a guide transition device is provided that includes a light source designed to generate a light beam, a light input port on a first plane and coupled to receive the light beam from the light source, and a light output port on a second plane different than the first plane. The light output port is designed to couple a received light beam to output equipment. The guide transition device further includes plane shifting apparatus coupled to receive the light beam from the light input port on the first plane and to shift or transfer the light beam to the second plane. The plane shifting apparatus includes one or more digital gratings each designed to deflect the light beam approximately ninety degrees. The plane shifting apparatus is further coupled to transfer the light beam to the light output port on the second plane.

To further achieve the desired objects and advantages of the present invention a specific embodiment of a guide transition device comprises a platform including a semiconductor waveguide defining a light input port for receiving a light beam. The semiconductor laser is positioned on a first plane and a distal end of the semiconductor waveguide is formed with a digital grating. A planarizing layer deposited on the platform in abutting engagement with the distal end planarizes the first plane. A lower polymer cladding layer deposited on the semiconductor waveguide and the planarizing layer, a polymer core deposited on the lower polymer cladding layer, and an upper polymer cladding layer deposited on the core and lower polymer cladding layer form a polymer waveguide on a second plane different than the first plane with a first end defining a light output port. Portions of the lower polymer cladding layer, the core, and the upper polymer cladding layer are removed to form an angular deflection surface at an end of the polymer waveguide opposite the first end. The digital grating and the angular deflection surface have compatible angles so that a light beam directed into the light input port defined by the semiconductor waveguide on the first plane is deflected into the core of the polymer waveguide on the second plane.

To further achieve the desired objects and advantages of the present invention a specific method of fabricating a guide transition device includes the step of providing a platform including a semiconductor waveguide defining a light input port for receiving a light beam with the semiconductor laser positioned on a first plane. The method includes the steps of etching one end of the semiconductor waveguide to define a distal end and depositing a planarizing layer on the platform in abutting engagement with the distal end. The method further includes the steps of depositing a lower polymer cladding layer on the semiconductor waveguide and the planarizing layer, depositing a polymer core on the lower polymer cladding layer, and depositing an upper polymer cladding layer on the core and lower polymer cladding layer. The lower polymer cladding layer, the polymer core, and the upper polymer cladding layer form a polymer waveguide on a second plane different than the first plane with a first end defining a light output port. The method further includes the steps of removing portions of the lower polymer cladding layer, the core, and the upper polymer cladding layer to form an angular deflection surface at an end of the polymer waveguide opposite the first end. The digital grating and the angular deflection surface have compatible angles so that a light beam directed into the light input port defined by the semiconductor waveguide on the first plane is deflected into the core of the polymer waveguide on the second plane.

BRIEF DESCRIPTION OF THE DRAWINGS

Specific objects and advantages of the invention will become readily apparent to those skilled in the art from the following detailed description of a preferred embodiment thereof, taken in conjunction with the drawings in which:

FIG. 8 is a top view of the guide transition device illustrated in FIG. 6, showing a Mach-Zehnder modulator implemented between taper regions, according to the present invention; and FIG. 9 illustrates a first step in the fabrication of the large spot design guide transition device of FIG. 6, in accordance with the present invention.

DETAILED DESCRIPTION OF THE DRAWINGS

A primary object of the present invention is to provide a new and improved guide transition device fabricated in light guiding apparatus including a substrate and multiple polymer layers. The guide transition device is designed to efficiently couple light from one layer or plane of the light guiding apparatus to another layer or plane of the light guiding apparatus to reduce optical cross-talk and other interference. In the preferred embodiment, the light guiding apparatus includes a light input port coupled to receive light from a light source, such as a semiconductor laser or waveguides fabricated to guide light from a laser, positioned on a first plane, plane shifting apparatus, including a digital grating coupled to receive the light from the light input port and to shift or transfer the light to another or second layer or plane having either a second digital grating or an angular deflection surface, above or below the first layer or plane, and a light output port on the second layer or plane coupled to the plane shifting apparatus and designed to couple light from the plane shifting apparatus to some type of output equipment, such as an optical fiber, waveguide, etc. The plane shifting apparatus can be, for example, a combination of a digital grating and an angular deflection surface or only digital gratings, explained in more detail below.

In this explanation a "digital grating" is a grating that receives light from a source and reflects/transmits the light in a well-known manner. Each grating is designed to improve either the reflection or transmission of the light in accordance with the specific application to which it is applied. The design can be castellated, sinewave, or a combination of both. The grating can be stepped in a castellated format, typically referred to as a multi-level grating. In the present invention, each digital grating is specifically designed to deflect a received light beam approximately (i.e. +/−10 degrees) 90 degrees.

Figure 1:
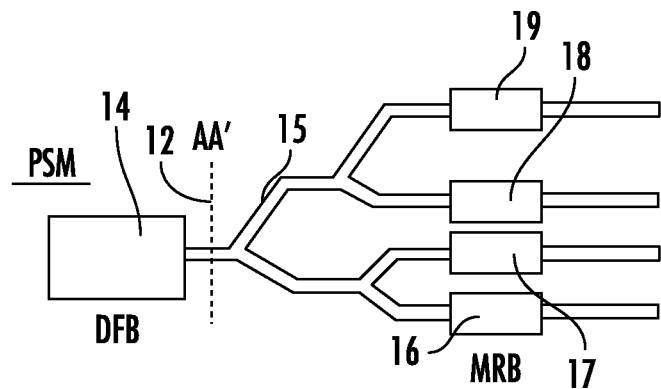
FIG. 1 is a top view of a phase shift modulation layout with a single laser source divided into four inputs for four different modulators using a guide transition device (GTD) to couple the four inputs into four waveguides and then out to four fiber cables, according to the present invention.

Turning to FIG. 1, an example of phase shift modulation apparatus 10 incorporating a guide transition device 12, in accordance with the present invention, is illustrated. In this example, guide transition device 12 receives light from a source 14, such as a semiconductor laser, on a first level and shifts or transfers the light to a second level. On the second level guide transition device 12 couples the light to a first waveguide 15 that is split into two waveguides using a splitter with each of the two waveguides being split for a total of four waveguides. Each of the four waveguides is then coupled to or passes through a modulator 16, 17, 18, and 19, respectively, and extends to the edge of the chip ready to launch the phase modulated light into fiber optics or the like. Modulators 16, 17, 18, and 19 can alternatively be intensity modulators, for example, a Mach-Zehnder modulator, a directional-coupler modulator, polarization modulator, etc. In all of the included embodiments the use of the term "modulator" is generic and includes all of the above listed modulators.

Figure 2:
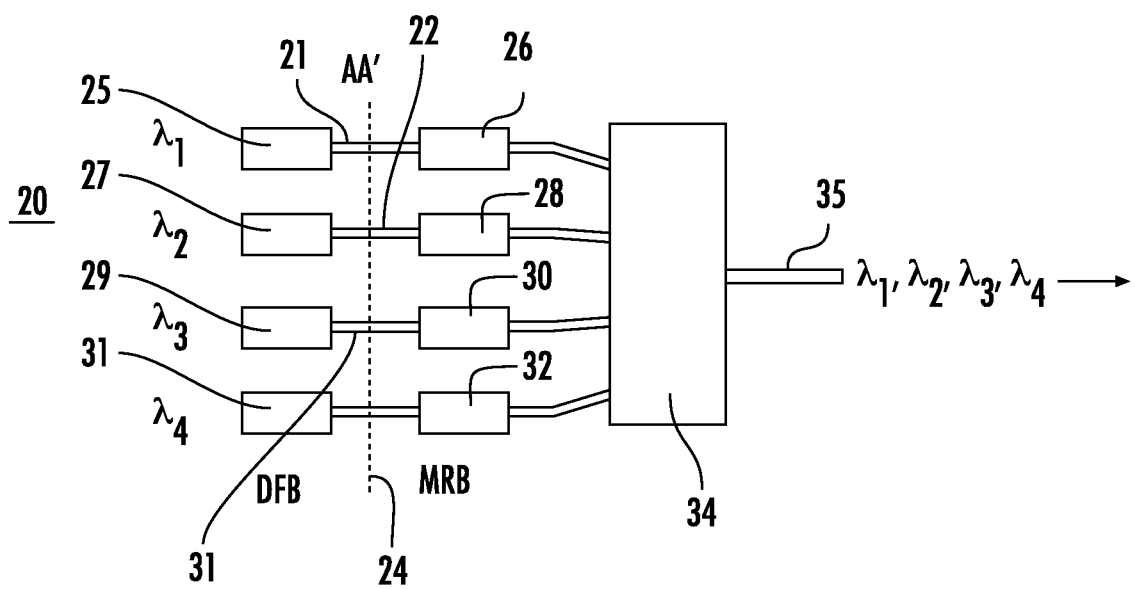
FIG. 2 is a top view of a WDM (wavelength division multiplexing) layout with four different wavelength lasers coupled by four GTDs and then mux'd into one waveguide and out to a fiber cable, according to the present invention.

Turning to FIG. 2, an example of wavelength division multiplexing (WDM) apparatus 20 incorporating four guide transition devices 21, 22, 23, and 24, in accordance with the present invention, is illustrated. Guide transition device 21 couples light from a light source 25, such as a semiconductor laser, on a first level, to a polymer waveguide and modulator 26 on a second, different level. Similarly, guide transition device 22 couples light from a light source 27 to a polymer waveguide and modulator 28 on a second, different level, guide transition device 23 couples light from a light source 29 to a polymer waveguide and modulator 30 on a second, different level, and guide transition device 24 couples light from a light source 31 to a polymer waveguide and modulator 32 on a second, different level. Light from polymer waveguides and modulators 26, 28, 30, and 32 is coupled to a multiplexer 34 where the four inputs are multiplexed down to a single output fiber 35. Examples of devices that can be used for multiplexer 34 include a multimode modulator interferometer (MMI), thin film filters, Eschelle gratings, arrayed waveguide gratings (AWG), or the like. Modulators 26, 28, 30, and 32 can be phase, polarization, or intensity modulators (see above).

Thus, in phase shift modulation apparatus 10 a single light source is coupled through a single guide transition device into four fibers and four modulators to produce four different phase (or intensity) signals. In WDM apparatus 20, four lasers operating at four different wavelengths, couple via four guide transition devices into four modulators/waveguides that are muxed into a single output fiber. In all instances the guide transition devices shift or transfer the light from the level or plane in which the light source lies, to another plane or level containing waveguides and modulators to essentially separate or insulate the waveguides source.

Figure 3:
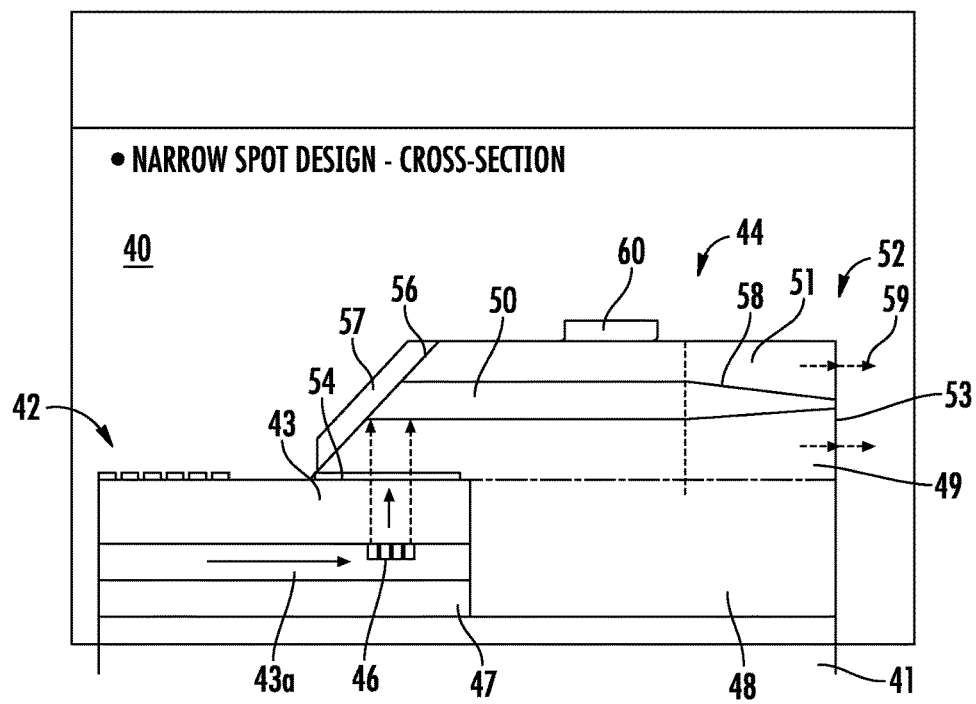
FIG. 3 is a cross-sectional view of an example of a narrow spot design for a guide transition device incorporating a grating deflector and an angular deflection surface in accordance with the present invention.

Referring now to FIG. 3, a guide transition device 40 is provided as an example of a guide transition device that could be used in either of phase shift modulation apparatus 10 or WDM apparatus 20 or any other light guiding apparatus. In this specific example, a monolithic semiconductor laser 42 and a polymer waveguide modulator 44 are included in device 40 and fabricated on a substrate 41, which in this preferred embodiment is monolithic InP but can be other semiconductors or metals, such as silicon, silicon carbide, GaN, GaAs, InSb, metals, sapphire, etc. Monolithic laser 42 can be a distributed feedback (DFB) laser, a Fabry-Perot (FB) laser, a distributed Bragg reflector (DBR) laser, a tunable laser, VCSEL (Vertical Cavity Surface Emitting Laser) or any other type of semiconductor laser. Laser 42 includes an output semiconductor waveguide 43 (with a core 43a) which has a digital grating 46 formed therein adjacent a distal end 47. For purposes of this disclosure, the portion of output semiconductor waveguide 43 receiving a light beam from laser 42 can be considered a "light input port". Digital grating 46 is specifically designed to turn light from source/laser 42 vertically upwardly. The epi material is removed from substrate 41 beyond end 47 to minimize the problems of trying to deposit polymers in a trench-like structure. A lower polymer layer 48 is deposited on substrate 41 to planarize substrate 41 beyond end 47. Alternatively, an insulating oxide or nitride could be deposited on substrate 41 to planarize substrate 41. These techniques are also compatible with use of a lower electrode to enable vertical poling in the polymer waveguide.

A relatively thick lower cladding layer 49 is deposited on the upper surfaces of laser 42 and lower polymer layer 48, a core polymer is deposited on the upper surface of lower cladding layer 49 and etched to form a waveguide core 50, and an upper polymer cladding layer 51 is deposited around waveguide core 50 to form a polymer waveguide 52. In some instances it may be desirable to deposit an anti-reflective (AR) coating 54 on the upper surface of output semiconductor waveguide 43 prior to depositing lower cladding layer 49 to reduce or remove any reflections at the abutting surfaces. Usually the AR coating can be completed via dielectric deposition using CVD, PECVD, sputtering, ebeam, etc. Materials for the dielectric coating can be, for example, oxides, nitrides, and combinations thereof deposited with a thickness for anti-reflection properties. Also, a relatively thick lower cladding layer 49 is deposited to minimize light leakage from polymer core 50 to substrate 41.

In this specific example, lower cladding layer 49, core 50, and upper polymer cladding layer 51 (i.e. polymer waveguide 52) are etched at an angle and through to the upper surface of output semiconductor waveguide 43 to form an angular deflection surface 56. In this example, digital grating 46 and angular deflection surface 56 are included in the plane shifting apparatus that shifts light from the laser source 42 on one plane to waveguide 52 and a light output surface or port 53 on a different plane. The angle of surface 56 is selected/formed to be compatible with the amount digital grating 46 is designed to turn or deflect light, resulting in high optical coupling into waveguide 52. In this preferred embodiment, digital grating 46 deflects the received light beam at an angle of approximately 90 degrees (plus or minus 10 degrees) and deflection surface 56 is compatible to deflect the received light beam into waveguide core 50 parallel to the second plane. To further enhance reflection at angular deflection surface 56, a high reflective coating 57 can be deposited on the outer surface of angular deflection surface 56. In this specific example, polymer waveguide modulator 44 is formed in waveguide 52 between angular deflection surface 56 and taper 58 of core 50. Modulator 44 can be for example, a Mach-Zehnder modulator, an intensity or phase modulator, etc.

A typical semiconductor laser will put-out a spot (beam area) with 35 degrees vertical divergence and 15 degrees horizontal divergence which means the laser beam diverges hugely. As explained, in the guide transition device 40 the laser beam is coupled into waveguide 52 which keeps the beam from diverging any more. Unfortunately, the dimensions of waveguide 52 are relatively tiny. Waveguide 52 will couple the spot (reflected laser beam) into the small dimensions of waveguide 52 and for guide transition device 40 to operate better between the planes or levels, there must be as much alignment tolerance (e.g. at the output of waveguide 52) as possible. Better alignment tolerance is achieved in guide transition device 40 by reducing core 50 of waveguide 52 to a taper 58 adjacent the output, which produces a large spot size, represented by broken lines 59, at the output edge of waveguide 52 for coupling into external equipment, such as fibers or the like. The large spot size 59 at the output makes the alignment of guide transition device 40 with exterior equipment easier and more manufacturable.

Figure 4:
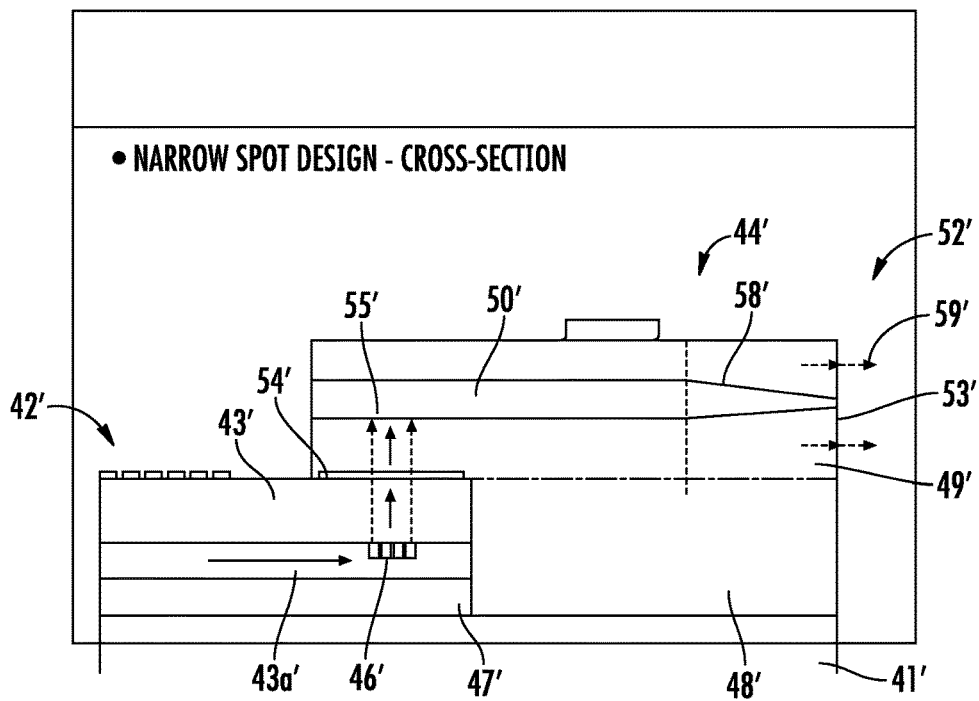
FIG. 4 is a cross-sectional view of an example of a narrow spot design for a guide transition device incorporating only grating deflectors in accordance with the present invention.

Referring additionally to FIG. 4, a guide transition device 40' is provided as another example of a guide transition device that could be used in either of phase shift modulation apparatus 10 or WDM apparatus 20 or any other light guiding apparatus. Guide transition device 40' incorporates only grating deflectors and does not include any angular deflection surface in accordance with the present invention. Components of guide transition device 40' that are the same as components of guide transition device 40 of FIG. 3 are designated with a similar number and a prime (') is added to indicate the different embodiment. Guide transition device 40' is similar in all respects to guide transition device 40, except that angular deflection surface 56 and high reflective coating 57 are replaced with a second digital grating 55'. Second digital grating 55' is formed in core 50' directly above anti-reflective (AR) coating 54' on the upper surface of output semiconductor waveguide 43' and first digital grating 46'. Second digital grating 55' deflects the received light beam at an angle of approximately 90 degrees (plus or minus 10 degrees) into core 50' and towards output surface 53'. It will be understood that the angle of deflection of digital grating 55' is selected/formed to be compatible with the amount digital grating 46 is designed to turn or deflect light, resulting in high optical coupling into waveguide 52'.

Here it should be understood that in many situations forming one or more of the digital gratings may be easier and more efficient than forming the angular deflection surfaces. For example, forming digital grating 46' in core 43a' may, at least in some instances, be simpler than forming the negative slanted angular deflection surface 46 which it replaces and which is provided and explained in the above described copending patent application.

Figure 5A:
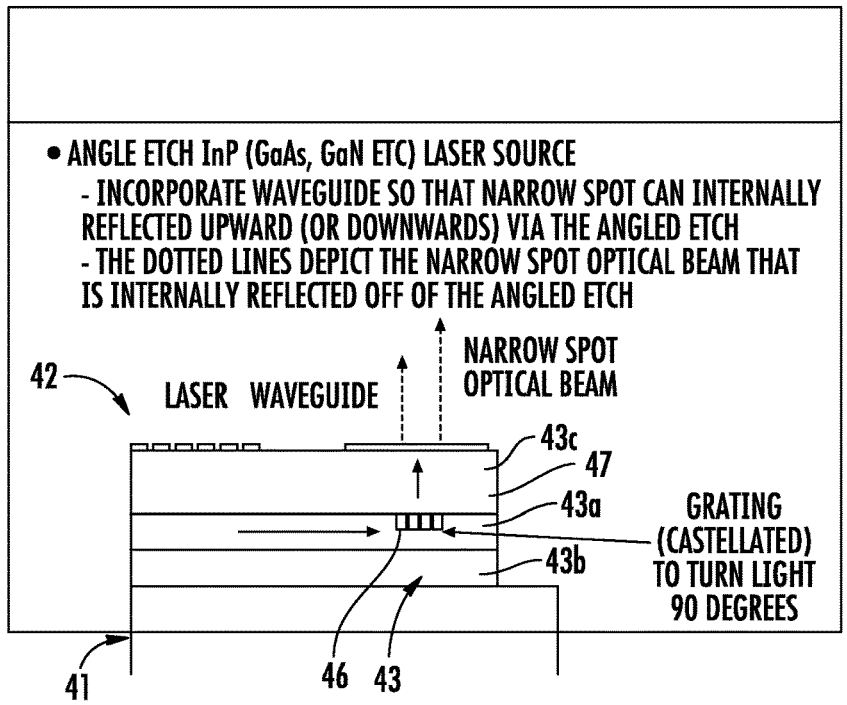
FIGS. 5A through 5H illustrate steps in the fabrication of the narrow spot design guide transition device of FIG. 3 in accordance with the present invention.

Referring now to FIGS. 5A through 5h, some sequential steps in a preferred process for fabricating guide transition device 40 are illustrated. For convenience of understanding, the same numbers used in FIG. 3 will be used in FIGS. 5A through 5h to designate the same components. Referring specifically to FIG. 5A, monolithic semiconductor laser 42 is fabricated on substrate 41, which in this preferred embodiment is InP but may be any semiconductor or metal material. Monolithic laser 42 can be a distributed feedback (DFB) laser, a Fabry-Perot (FB) laser, a distributed Bragg reflector (DBR) laser, a tunable laser, VCSEL (Vertical Cavity Surface Emitting Laser) or any other type of semiconductor laser. Laser 42 includes an output waveguide 43 (with a core 43a) which is vertically etched to form end 47 and most of the epi material is removed from substrate 41 beyond end 47 to minimize the problems of trying to deposit polymers in a trench-like structure. During the formation of output waveguide 43, core 43a is deposited on a lower cladding layer 43b and grating 46 is formed in core 43a during deposition/etching of core 43a. An upper cladding layer 43c is deposited over and around core 43a to complete waveguide 43. Anti-reflective (AR) coating 54 (if included) is then deposited on the upper surface of output semiconductor waveguide 43.

Figure 5B:
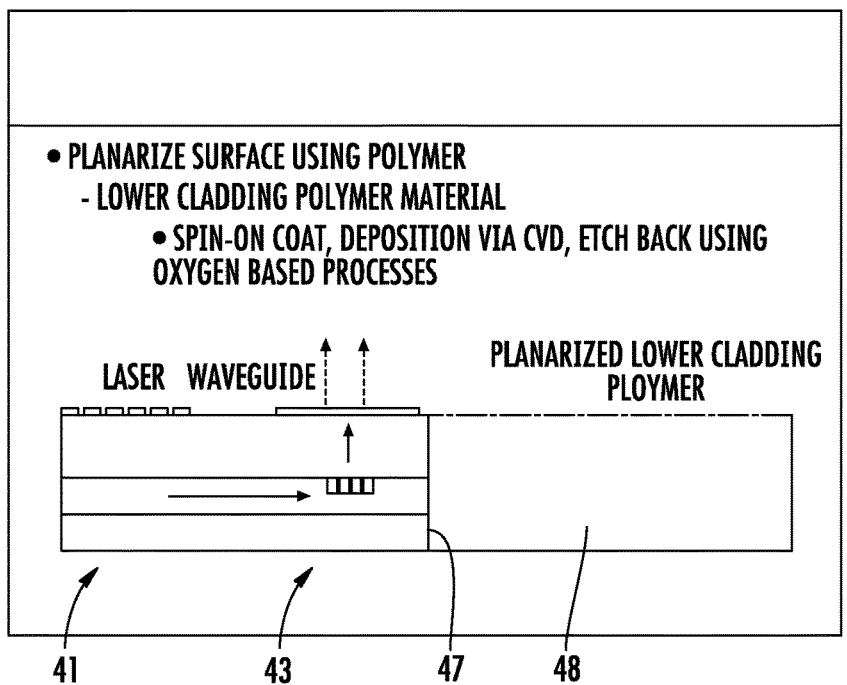

Referring additionally to FIG. 5B, lower polymer layer 48 is deposited on substrate 41 to planarize substrate 41 and to mate with surface 47. In this preferred embodiment lower polymer layer 48 is a spin-on coat or it could be deposited by CVD. After deposition lower polymer layer 48 is etched back using an oxygen based process to planarize lower polymer layer 48.

Figure 5C:
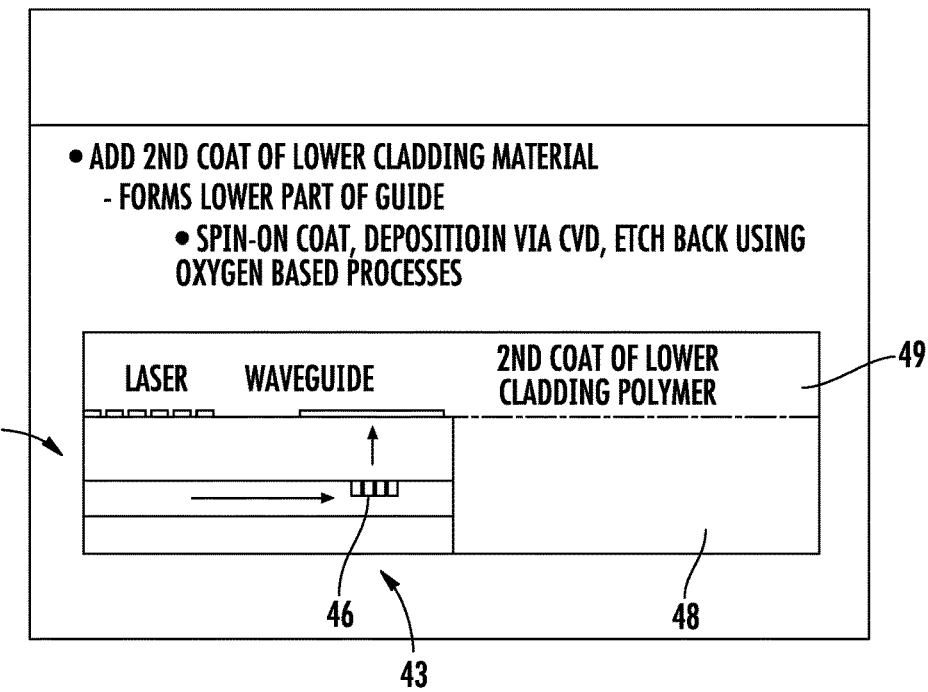
Figure 5D:
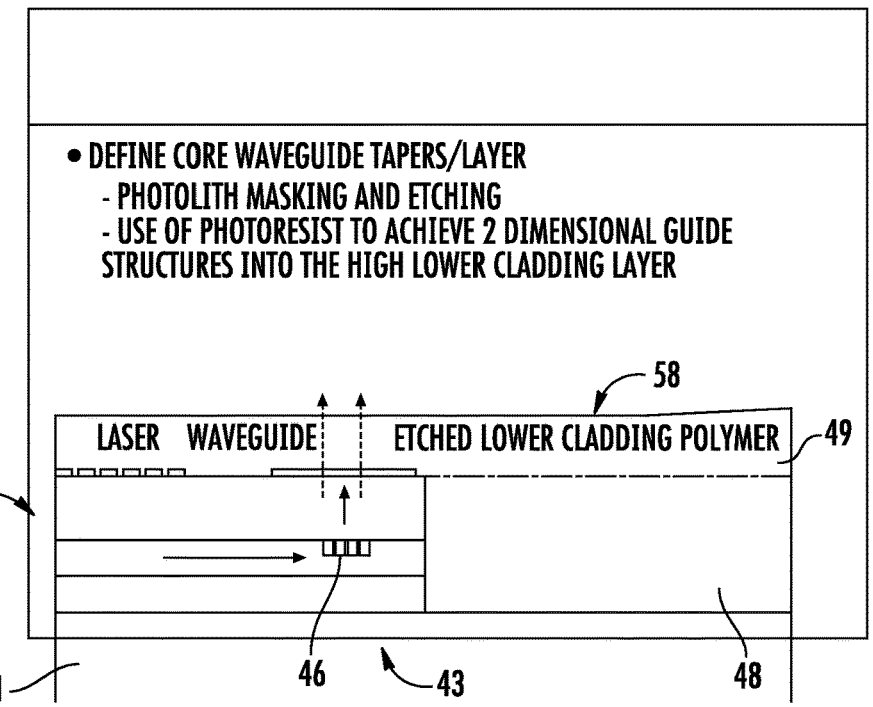

Referring additionally to FIG. 5C, a relatively thick lower cladding layer 49 is deposited on the upper surfaces of laser 42 and lower polymer layer 48. In this preferred embodiment lower cladding layer 49 is a spin-on coat or it could be deposited by CVD. After deposition lower cladding layer 49 is etched back using an oxygen based process to planarize lower cladding layer 49 and achieve a desired thickness. To reduce core 50 of waveguide 52 to taper 58 adjacent the output, photolithography masking and etching are used to define 2-dimensional taper 58 in the upper surface of lower cladding layer 49, as illustrated in FIG. 5D.

Figure 5E:
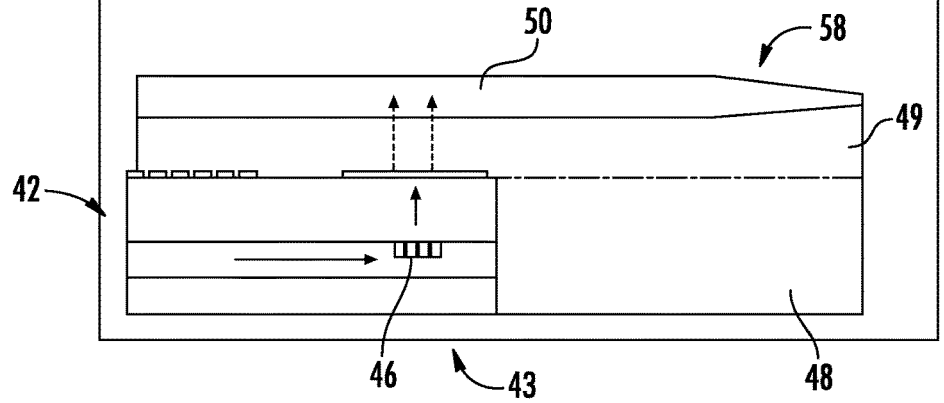
Figure 5F:
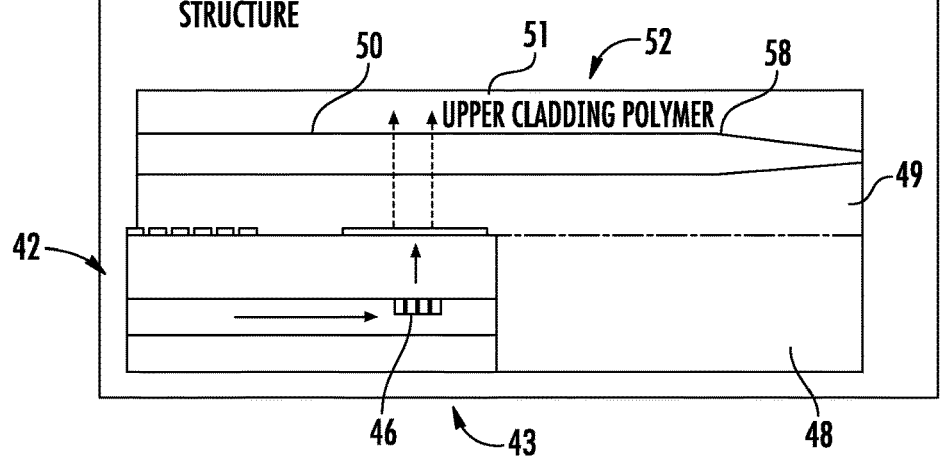

Referring additionally to FIG. 5E, a layer of polymer material is deposited on the upper surface of lower cladding layer 49 and shaped into waveguide core 50, including 2-dimensional taper 58, using photolithography masking and etching. Referring additionally to FIG. 5F, upper cladding layer 51 is deposited on lower cladding layer 49 and surrounding core 50. In this preferred embodiment upper cladding layer 51 is deposited using spin-on deposition techniques and the conformity with core 50 planarizes waveguide 52.

Figure 5G:
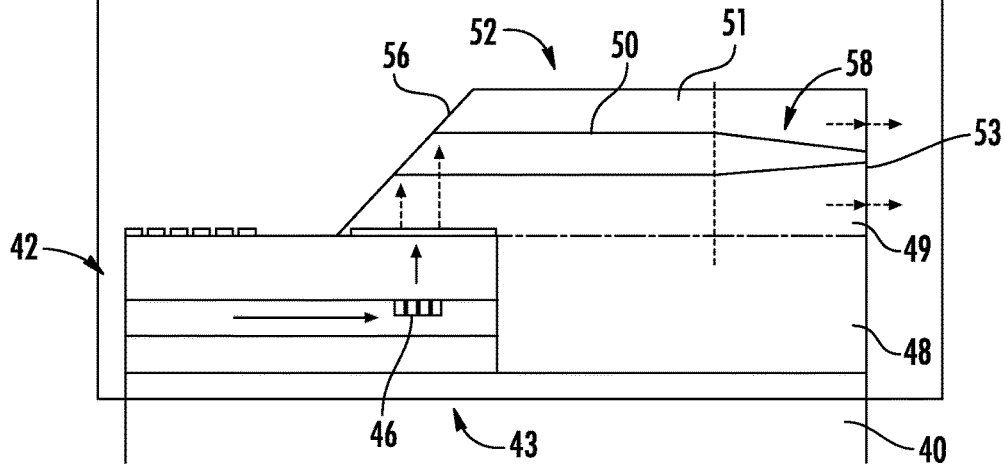
Figure 5H:
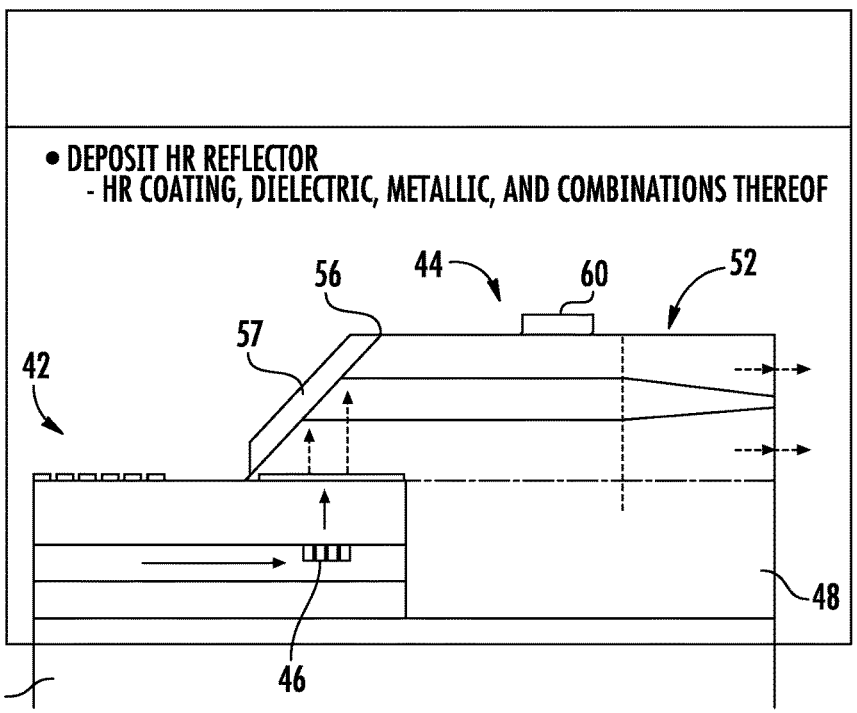

Turning to FIG. 5G, lower cladding layer 49, core 50, and upper polymer cladding layer 51 (i.e. polymer waveguide 52) are etched at an angle and through to the upper surface of laser 42 to form an angular deflection surface 56. The angle of surface 56 is selected to be compatible with the deflection angle of grating 46, resulting in high optical coupling into waveguide 52. Preferably, an HR (high reflectivity) reflector 57 is deposited on the outer surface of angular deflection surface 56, as illustrated in FIG. 5H. HR reflector 57 can be, for example, an HR coating, dielectric material, metallic, or combinations thereof. Metallic electrodes, designated 60 in FIG. 5H, are added for electrical connections to modulator 44.

Figure 6:
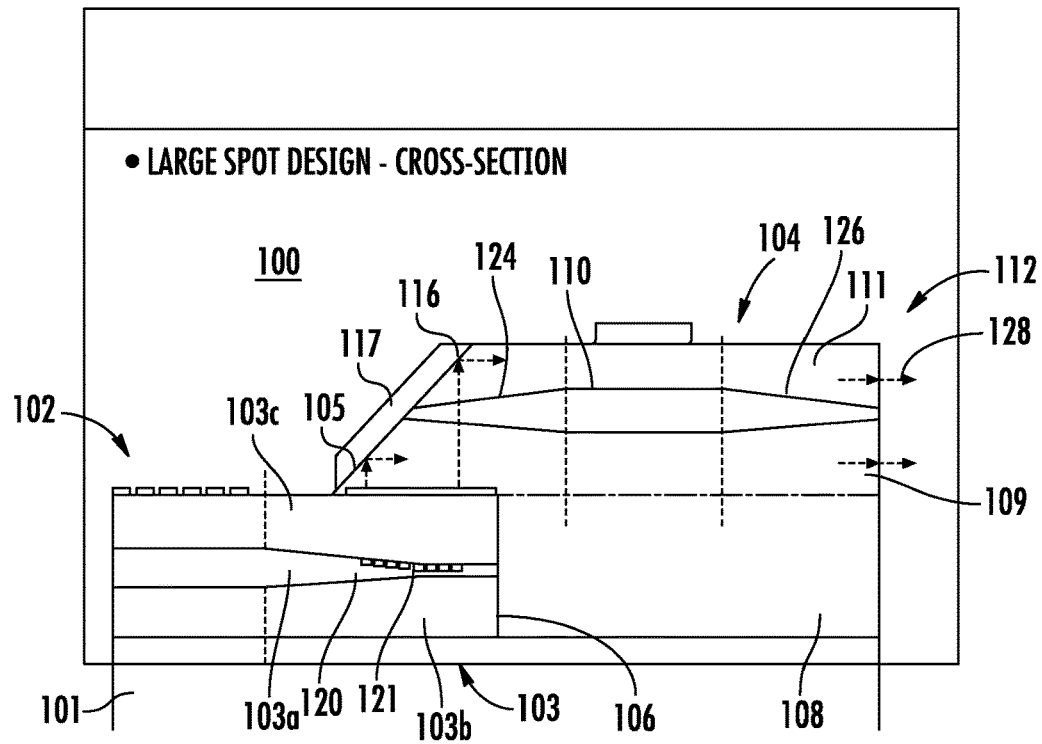
FIG. 6 is a cross-sectional view of an example of a large spot design for a guide transition device incorporating a grating deflector and an angular deflection surface in accordance with the present invention.

Referring now to FIG. 6, a guide transition device 100 is provided as an example of a guide transition device that could be used in either of phase shift modulation apparatus 10 or WDM apparatus 20 or any other light guiding apparatus. In this specific example, a monolithic semiconductor laser 102 and a polymer waveguide modulator 104 are included in device 100 and fabricated on a substrate 101, which in this preferred embodiment is monolithic InP but can be other semiconductors or metals, such as silicon, silicon carbide, GaN, GaAs, InP, metals, sapphire, etc. Monolithic laser 102 can be a distributed feedback (DFB) laser, a Fabry-Perot (FB) laser, a distributed Bragg reflector (DBR) laser, a tunable laser, VCSEL (Vertical Cavity Surface Emitting Laser) or any other type of semiconductor laser. Laser 102 includes an output semiconductor waveguide 103 (with a core 103a, a lower cladding layer 103b and an upper cladding layer 103c) which is etched to form a substantially vertical end surface 106 and most of the epi material is removed from substrate 101 beyond surface 106 to minimize the problems of trying to deposit polymers in a trench-like structure.

During the formation of core 103a, a portion adjacent surface 106 is reduced to a taper 120, which produces a large spot size. Also, a digital grating 121 is formed in the taper 120 which is designed to deflect light from laser 102 upwardly approximately 90 degrees. Generally, lower cladding layer 103b is deposited and etched to form the lower side of taper 120, core 103a is deposited and etched to complete taper 120 and form digital grating 121, and upper cladding layer 103c is deposited to enclose taper 120 and digital grating 121 and etched to provide an upper planar surface.

A lower polymer layer 108 is deposited on substrate 101 to planarize substrate 101. Alternatively, an insulating oxide or nitride could be deposited on substrate 101 to planarize substrate 101. These techniques are also compatible with use of a lower electrode to enable vertical poling in the polymer waveguide.

A relatively thick lower cladding layer 109 is deposited on the upper surfaces of output semiconductor waveguide 103 and lower polymer layer 108, a core polymer is deposited on the upper surface of lower cladding layer 109 and etched to form a waveguide core 110, and an upper polymer cladding layer 111 is deposited around waveguide core 110 to form a polymer waveguide 112. In some instances it may be desirable to deposit an anti-reflective (AR) coating 105 on the upper surface of output semiconductor waveguide 103 prior to depositing a lower cladding layer 109 to reduce or remove any reflections at the abutting surfaces. Usually the AR coating can be completed via dielectric deposition using CVD, PECVD, sputtering, ebeam, etc. Materials for the dielectric coating can be, for example, oxides, nitrides, and combinations thereof deposited with a thickness for anti-reflection properties. Also, a relatively thick lower cladding layer 109 is deposited to minimize light leakage from polymer core 110 to substrate 101.

Lower cladding layer 109, core 110, and upper polymer cladding layer 111 (i.e. polymer waveguide 112) are etched at an angle and through to the upper surface of output semiconductor waveguide 103 to form an angular deflection surface 116. In this example, digital grating 121 and angular deflection surface 116 are included in the plane shifting apparatus that shifts light from the laser source on one plane to waveguide 112 and the light output on a different plane. The angle of surface 116 is selected to be compatible with the deflection angle of digital grating 121, resulting in high optical coupling into waveguide 112. To further enhance reflection at angular deflection surface 116, a high reflective coating 117 can be deposited on the outer surface of angular deflection surface 116.

For guide transition device 100 to operate most efficiently between the planes or levels and to make the alignment of guide transition device 100 easier and more manufacturable, there must be as much alignment tolerance as possible between the layers or planes. Better alignment tolerance is achieved in guide transition device 100 by reducing core 103a of laser output waveguide 103 to a taper 120 adjacent surface 106, which produces a large spot size, supplied to digital grating 121 and, thus, to angular deflection surface 116. The large spot size deflected by digital grating 121 onto angular deflection surface 116 at the input of waveguide 112 makes the alignment of guide transition device 100 easier and more manufacturable.

To further enhance alignment tolerance in guide transition device 100, waveguide core 110 includes a taper 124 in which the dimensions of core 110 are reduced as core 110 progresses from a midpoint to adjacent angular deflection surface 116. Taper 124, in conjunction with the large spot size deflected onto angular deflection surface 116, substantially increases alignment tolerance between the planes. Also, better alignment tolerance is achieved in guide transition device 100 by reducing core 110 of waveguide 112 to a taper 126 adjacent the output, which produces a large spot size, represented by broken lines 128, at the output edge of waveguide 112 for coupling into external equipment, such as fibers or the like. The large spot size 126 at the output makes the alignment of guide transition device 100 with exterior equipment easier and more manufacturable. In this specific example, polymer waveguide modulator 104 is formed in waveguide 112 between taper 124 and taper 126 of core 110. Modulator 104 can be for example, a Mach-Zehnder modulator, an intensity, polarization, or phase modulator, etc.

Figure 7:
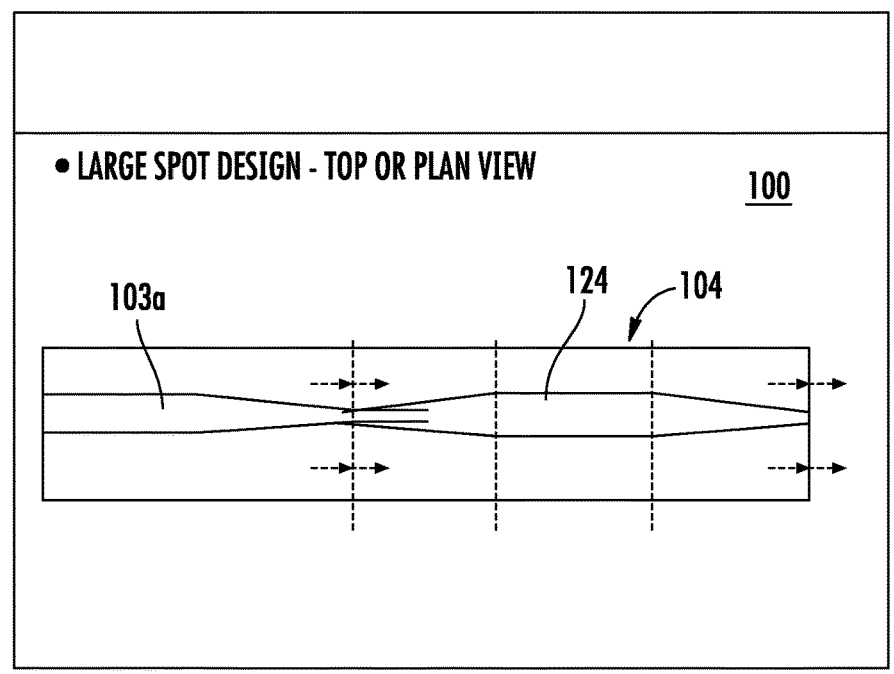
FIG. 7 is a top view of the guide transition device illustrated in FIG. 6.

Referring to FIG. 7, a top plan view of guide transition device 100 is provided to illustrate the horizontal tapers of cores 103a and 124. Also in this example modulator 104 is an intensity, polarization, or phase modulator, etc. Referring additionally to FIG. 8, a top plan view of guide transition device 100 is provided to illustrate the incorporation of a Mach-Zehnder modulator as modulator 104. In this example to include a Mach-Zehnder modulator, core tapers 124 and 126 are designed much smaller to accommodate the Mach-Zehnder interferometer. The purpose of the examples illustrated in FIGS. 7 and 8 are to illustrate specifically how various modulators can be incorporated into a guide transition device in accordance with the present invention.

Referring now to FIG. 9, an initial sequential step in a preferred process for fabricating guide transition device 100, is illustrated. After the fabrication of output semiconductor waveguide 103 with taper 120 and digital grating 121, anti-reflective (AR) coating 105 can be deposited on the upper surface of output semiconductor waveguide 103 prior to depositing lower cladding layer 109. The remaining steps for the fabrication of guide transition device 100 are basically the same as the steps illustrated and explained in and with reference to FIGS. 5B through 5H above.

Thus, a new and improved guide transition device for efficiently coupling light between devices and to output apparatus is disclosed. The new and improved guide transition device is specifically designed with one or more digital gratings to improve and/or simplify fabrication of guide transition devices.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A guide transition device comprising:
a platform of semiconductor material;
a monolithic semiconductor laser and a semiconductor waveguide formed as a part of the platform and designed to generate a light beam, the semiconductor waveguide defining a light input port for receiving the light beam from the monolithic semiconductor laser, the monolithic semiconductor laser and the semiconductor waveguide being positioned on a first plane;
a lower cladding layer, a polymer core, and an upper cladding layer forming a polymer waveguide and included polymer modulator positioned on the platform at least partially on the semiconductor waveguide, the polymer waveguide and polymer modulator being on a second plane different than the first plane with a first end defining a light output port on the second plane, the light output port designed to couple a received light beam to output equipment; and
plane shifting apparatus coupled to receive the light beam from the light input port on the first plane and to shift or transfer the light beam to the second plane, the plane shifting apparatus including one or more digital gratings and one or more angular deflection surfaces each designed to deflect the light beam approximately ninety degrees, the plane shifting apparatus being coupled to transfer the light beam to the light output port on the second plane.

2. The guide transition device as claimed in claim 1 wherein the monolithic semiconductor laser consist of a distributed feedback laser, a Fabry-Perot laser, a distributed Bragg reflector laser, a VCSEL, or a tunable laser.

3. The guide transition device as claimed in claim 1 wherein the polymer modulator consists of a Mach-Zehnder modulator, an intensity modulator, polarization modulator, or a phase modulator.

4. The guide transition device as claimed in claim 1 wherein the plane shifting apparatus includes a digital grating of the one or more digital gratings positioned on the first plane and an angular deflection surface of the one or more angular deflection surfaces positioned on the second plane, the digital grating positioned to receive the light beam from the light input port and to deflect the light beam to the angular deflection surface, and the angular deflection surface positioned to deflect the light beam into light communication with the output port.

5. The guide transition device as claimed in claim 4 wherein the digital grating is designed to deflect the received light beam approximately ninety degrees and the angular deflection surface is positioned at an angle that is compatible with the deflection of the digital grating to direct the light beam parallel to the second plane.

6. The guide transition device as claimed in claim 1 wherein the semiconductor waveguide core is tapered in cross-sectional area from a midpoint to adjacent an etched distal surface and the core of the polymer waveguide is tapered in cross-sectional area from a midpoint to adjacent the light output port.

7. The guide transition device as claimed in claim 1 wherein the core of the polymer waveguide is tapered in cross-sectional area from a midpoint to adjacent an angular deflection surface of the one or more angular deflection surfaces.

8. The guide transition device as claimed in claim 1 further including an anti-reflective coating positioned on an upper surface of the semiconductor waveguide between the semiconductor waveguide and the lower cladding layer and an angular deflection surface of the one or more angular deflection surfaces has a high reflective coating deposited on an outer surface thereof.

9. A guide transition device comprising:
a semiconductor platform;
a monolithic semiconductor laser and a semiconductor waveguide formed as a part of the semiconductor platform, the semiconductor waveguide defining a light input port for receiving a light beam from the monolithic semiconductor laser, the monolithic semiconductor laser and the semiconductor waveguide being positioned on a first plane;
a digital grating formed in a distal end of the semiconductor waveguide;
a planarizing layer deposited on the semiconductor platform in abutting engagement with the distal end of the semiconductor waveguide;
a lower polymer cladding layer on the semiconductor waveguide and the planarizing layer, a polymer core deposited on the lower polymer cladding layer, and an upper polymer cladding layer deposited on the core and lower polymer cladding layer, the lower polymer cladding layer, the polymer core, and the upper polymer cladding layer forming a polymer waveguide and included polymer modulator on a second plane different than the first plane with a first end defining a light output port; and portions of the lower polymer cladding layer, the core, and the upper polymer cladding layer removed to form an angular deflection surface at an end of the polymer waveguide opposite the first end, the digital grating and the angular deflection surface having compatible angles so that a light beam directed into the light input port defined by the semiconductor waveguide on the first plane is deflected into the core of the polymer waveguide on the second plane.

10. The guide transition device as claimed in claim 9 wherein the polymer modulator consists of a Mach-Zehnder modulator, an intensity modulator, polarization modulator, or a phase modulator.

* * * * *